(12) United States Patent
Lule et al.

(10) Patent No.: US 7,145,123 B2
(45) Date of Patent: Dec. 5, 2006

(54) CMOS LIGHT SENSING CELL

(75) Inventors: Tarek Lule, Saint Egreve (FR);
Stephan Benthien, Domene (FR)

(73) Assignee: STMicroelectronics S.A., Montrouge (FR)

( * ) Notice: Subject to any disclaimer, the term of this patent is extended or adjusted under 35 U.S.C. 154(b) by 7 days.

(21) Appl. No.: 10/916,902

(22) Filed: Aug. 12, 2004

(65) Prior Publication Data
US 2005/0040320 A1   Feb. 24, 2005

(30) Foreign Application Priority Data
Aug. 21, 2003   (EP) .................................. 03354072

(51) Int. Cl.
*H04N 5/217*   (2006.01)
*H01L 27/00*   (2006.01)

(52) U.S. Cl. .............................. 250/208.1; 250/214 A; 348/241; 348/300

(58) Field of Classification Search ............ 250/208.1, 250/208.2, 214 A; 257/223; 327/522; 348/241; 348/300, 302, 307, 308–310
See application file for complete search history.

(56) References Cited

U.S. PATENT DOCUMENTS 5,296,696 A * 3/1994 Uno ........................ 250/208.1
5,322,994 A   6/1994 Uno
6,587,142 B1   7/2003 Kozlowski et al.

OTHER PUBLICATIONS

European Search Report from European Patent Application 03354072.5, filed Aug. 21, 2003.
Patent Abstracts of Japan, vol. 2000, No. 23, Feb. 10, 2001 & JP 2001 177084 A (Olympus Optical Co Ltd.) Jun. 29, 2001.
Patent Abstracts of Japan, vol. 2000, No. 16, May 8, 2001 & JP 2001 004681 A (Olympus Optical Co Ltd.) Jan. 12, 2001.
Patent Abstracts of Japan, vol. 1997, No. 11, Nov. 28, 1997 & JP 09 199703 A (Canon Inc.), Jul. 31, 1997.
Pain B. et al. "Reset noise suppression in two-dimensional CMOS photodiode pixels through column-based feedback-reset" International Electron Devices Meeting 2002. IEDM. Technical Digest. San Francisco, CA, Dec. 8-11, 2002, New York, NY: IEEE, US, Dec. 8, 2002, pp. 809-812, XP010626163 ISBN: 0-7803-7462-2.

* cited by examiner

*Primary Examiner*—Stephone B. Allen
(74) *Attorney, Agent, or Firm*—Lisa K. Jorgenson; James H. Morris; Wolf, Greenfield & Sacks, P.C.

(57) ABSTRACT

A light sensing cell comprising output circuitry for generating an output voltage depending on the voltage of a sensing node, the voltage of the sensing node varying as a function of a received light; a reset transistor operable to force the voltage of the sensing node to a reset voltage; a feedback loop including an operational amplifier operable to add through a capacitive voltage divider a correction voltage to the voltage of the sensing node, said correction voltage depending on the output voltage; and preset mean circuitry for, during the operation of the reset transistor and until the amplifier is operated, setting the input of the capacitive voltage divider to a predetermined voltage.

11 Claims, 3 Drawing Sheets

CMOS LIGHT SENSING CELL

BACKGROUND OF THE INVENTION

1. Field of the Invention

The invention relates to integrated CMOS light sensing arrays comprising light sensing cells, and in particular to the structure of the light sensing cells.

2. Discussion of the Related Art

CMOS light sensing arrays integrated on chips are widely used in modem imaging devices such as digital cameras or scanners. A light sensing array typically comprises light sensing cells, or pixels, arranged in rows and columns.

FIG. 1 represents a typical light sensing cell of a CMOS light sensing array composed of cells arranged in rows and columns. Such a light sensing cell is for example described in C. Staller et al., "A radiation hard, low background multiplexer design for spacecraft imager applications" in Infrared Readout Electronics, Proc. SPIE, Vol. 1684, pp. 175–181 (1992). The cell comprises a sensor D1, capacitors C1 and C2, and CMOS transistors T1, T2 and T3 of N-channel type. The sensor D1 converts the light received on a sensitive surface into a sensing current Is drawn from a sensing node 2. The capacitor C1 is connected between the sensing node 2 and an output node 4. Output node 4 is connected to a current source 6 supplying a DC supply current I. One single current source 6 is typically connected to all the cells of the same column of the array. The transistor T1 has a gate connected to node 2. The capacitor C2, corresponding to the gate capacitor of transistor T1, is connected between the sensing node 2 and ground GND. The transistor T1 has a source connected to ground and a drain connected to the source of transistor T2. The drain of transistor T2 is connected to the output node 4, and the gate of transistor T2 is connected to a non-illustrated selection block provided for supplying a selection signal SEL. The transistor T3 has its drain connected to the output node 4 and its source connected to the sensing node 2. The gate of transistor T3 is connected to a reset block provided for supplying a reset signal RST.

The cell typically operates as follows. The cell is initially selected by the activation of the selection signal SEL, which closes transistor T2. The cell is then reset by the activation of the signal RST, which closes transistor T3 and short-circuits capacitor C1. After a transitory state, the cell stabilizes in a state where capacitor C1 is discharged and capacitor C2 is charged to a voltage Vrst which depends mainly on I and the threshold voltage of T1. Node 2 then has a stable voltage Vrst, since an increment of the voltage of node 2 increases the current through transistor T1, which discharges node 4 and lowers the voltage of node 2 back to Vrst. In the same way, a decrement of the voltage of node 2 increases the current through transistor T1, so I can charge node 4 and increase the voltage of node 2 back to Vrst.

The reset mode of the cell is then ended (the reset signal RST is inactivated, thus opening the transistor T3) after a given reset time, to enter an acquisition mode. If the sensing current is null, the state of the cell does not change. However, a non-null sensing current Is discharges the capacitor C2, which lowers the gate voltage of transistor T1 and lowers the conductivity of transistor T1. This directs a fraction of the supply current I to the capacitor C1, which charges as a function of the sensing current drawn by the sensor.

Accordingly, the voltage of output node 4 is a function of the sensing current Is drawn by the sensor. A non-illustrated measuring block is provided for measuring the voltage of node 4 a predetermined time (known as the integration time) after the opening of transistor T3. The amount of light received by the sensing cell during the integration time is then determined on the basis of the measured voltage.

A drawback of the above light sensing cell is due to the thermal noise in the transistor T3, which causes capacitor C1 to be charged with a random low parasitic voltage at the opening of transistor T3. If the sensor receives a large quantity of light and supplies a strong sensing current Is, the capacitor C1 charges rapidly and the parasitic voltage is negligible compared to the voltage at the output node. However, if the sensor receives only a small quantity of light and supplies a low sensing current Is, the capacitor C1 charges slowly and the parasitic voltage is no longer negligible compared to the voltage of the output node. The thermal noise therefore considerably lowers the performance of the sensing cell in poorly lit environments.

It is important for a good operation of the sensing cell that capacitor C2 be as small as possible, and that capacitor C1 be as small as possible compared to capacitor C2. However, the smaller the capacitor C1 is, the less the thermal noise is negligible. As an example, for a typical capacitor C2 of 6 fF, a capacitor C1 of 2 fF is preferably used, thus giving rise to a random parasitic voltage that may reach more than 1 $mV_{rms}$ while a typical value of the output node voltage in a poorly lit environment may be only a few 10 mV.

Some known sensing cells solve the above problem by using specific elements such as a photogate inside the sensing cell. However, such elements are not available with typical CMOS processes.

B. Fowler et al., in "Low Noise Readout using active reset for CMOS APS", Proc. SPIE, Vol. 3965, pp. 126–135, 2000; B. Pain et al., in "Reset Noise Suppression in Two-Dimensional CMOS Photodiode Pixels through Column-based Feedback Reset", IEDM Technical Digest, pp. 809–812, December 2002 and I. Takayanagi et al., in "A Four Transistor Capacitive Feedback Reset Active Pixel and its Reset Noise Reduction Capability", 2001 IEEE Workshop on Charge Coupled Devices and Advanced Image Sensors, pp. 118–121, 2001, have each developed specific solutions for suppressing the thermal noise in a CMOS light sensing cell, but none of these solutions is applicable to the pixel type described above.

There is a need for a CMOS sensing cell that is based on the pixel type described above and that is not prone to the above thermal noise problem.

SUMMARY OF THE INVENTION

The invention provides for such a CMOS light sensing cell.

The invention also provides for an integrated light sensing array comprised of such CMOS light sensing cells, and for a chip comprising such a light sensing array.

To achieve these objects and others, the invention provides for a light sensing cell comprising output means for generating an output voltage depending on the voltage of a sensing node, the voltage of the sensing node varying as a function of a received light; a reset transistor operable to force the voltage of the sensing node to a reset voltage; a feedback loop comprising an operational amplifier operable to add through a capacitive voltage divider a correction voltage to the voltage of the sensing node, said correction voltage depending on the output voltage; and preset means for, during the operation of the reset transistor and until the amplifier is operated, setting the input of the capacitive voltage divider to a predetermined voltage.

According to an embodiment of the invention, the light sensing cell comprises a sensor for converting the received light into a sensing current, the sensing node receiving said sensing current; a first capacitor being connected between the sensing node and an output node, said output node also receiving a supply current, and a second capacitor connecting the sensing node to the ground; the output means comprises an output transistor controlled by the voltage of the sensing node and coupled between the output node and the ground; the operational amplifier has a first input receiving the voltage of the output node and a second input receiving a reference voltage, the output of the amplifier being connected to the input of the capacitive voltage divider through a first switch; and the capacitive voltage divider comprises a third capacitor connected between the input of the capacitive voltage divider and the sensing node and a fourth capacitor connected between the input of the capacitive voltage divider and the ground.

According to an embodiment of the invention, the output transistor is coupled to the output node through a cell selection switch controlled by a cell selection signal.

The invention also provides for a light sensing array comprised of a plurality of the above light sensing cells.

According to an embodiment of the invention, the light sensing cells form a plurality of groups, the feedback means of the light sensing cells of a same group sharing a same operational amplifier.

According to an embodiment of the invention, the output nodes of the light sensing cells of a same group are coupled to a same supply current source.

According to an embodiment of the invention, the light sensing cells are arranged in rows and columns, each column forming one of said groups.

The invention also provides for an integrated circuit comprising the above light sensing array.

These objects, features and advantages, as well as others of the invention will be described in detail in the following non-limitative description of exemplary embodiments, taken in conjunction with the appended figures.

DETAILED DESCRIPTION

The same reference numbers correspond to the same elements in the different Figures. For clarity's sake, only the elements that are useful to the understanding of the invention have been illustrated.

Figure 1:
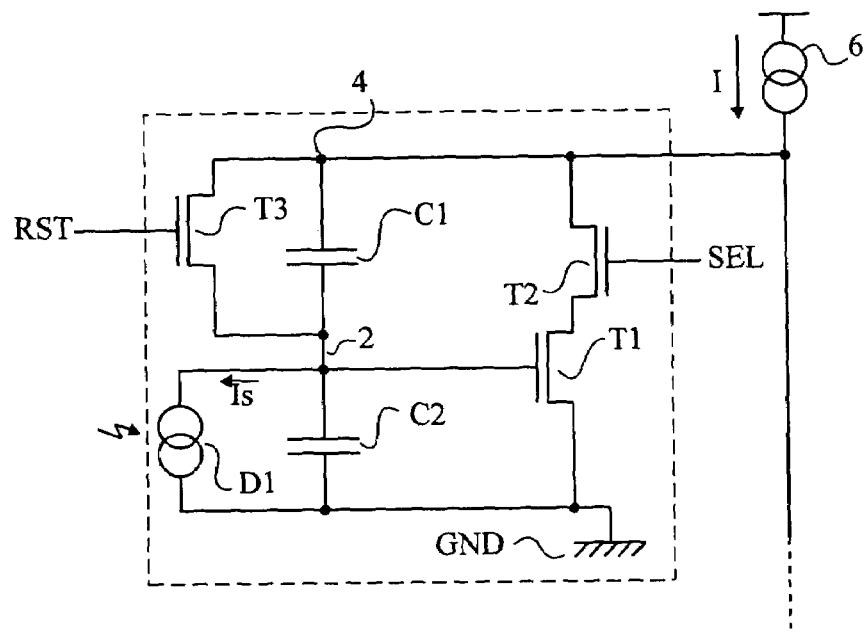
FIG. 1, represents a conventional CMOS light sensing cell.
Figure 2:
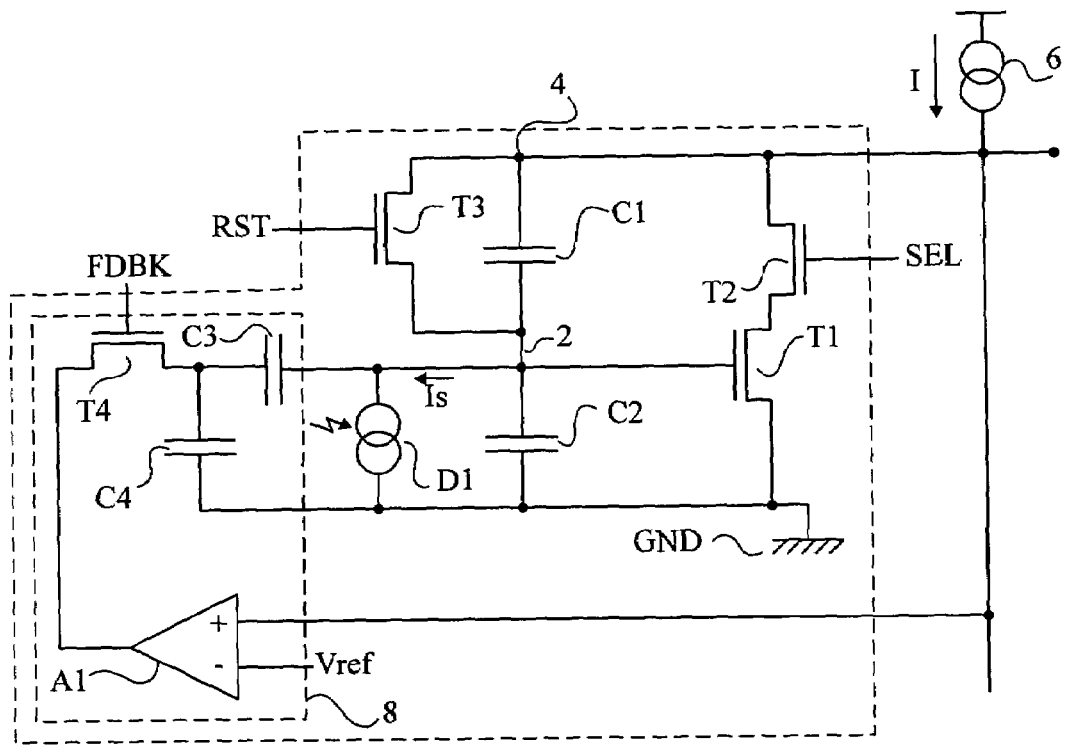
FIG. 2 schematically represents a CMOS light sensing cell illustrating an aspect of the invention.

FIG. 2 schematically represents a CMOS light sensing cell illustrating an aspect of the invention, comprising a sensor D1, capacitors C1 and C2, and CMOS transistors T1, T2 and T3, connected as in FIG. 1.

The sensing cell further comprises a feedback block 8 comprised of an operational amplifier A1, capacitors C3 and C4 and a MOS transistor T4 of N-channel type. The non-inverting and inverting input of the operational amplifier A1 are respectively connected to the output node 4 and to a reference voltage Vref that will be described later. The output of the operational amplifier A1 is connected to the source of transistor T4. The gate of transistor T4 is connected to a non-illustrated control block supplying a feedback control signal FDBK. The drain of transistor T4 is connected to the sensing node 2 through the capacitor C3. The drain of transistor T4 is connected to the ground through the capacitor C4.

The operation of the light sensing cell of FIG. 2 is as follows. As in a typical light sensing cell, the transistor T2 is first closed (i.e., rendered conducting) to select the cell, then the transistor T3 is closed for a given reset time to reset the cell. The signal FDBK is activated to close transistor T4 when the transistor T3 is closed (preferably, transistors T3 and T4 are closed simultaneously).

After a transitory state following the closing of T3 and T4, the cell stabilizes in a stable state where capacitor C1 is discharged and capacitor C2 is charged to a voltage Vrst. The non-inverting input of the operational amplifier A1 then receives the voltage Vrst of node 4, and amplifier A1 supplies a given feedback voltage Vfbk that depends on Vrst−Vref and on the amplifying factor of A1. Capacitors C4 and C3 are then charged through transistor T3 respectively to the voltage Vfbk, and to a voltage Vrst−Vfbk. The voltage Vfbk can be set to a desired value by an appropriate value of the reference voltage Vref.

The signal FDBK is kept activated so that transistor T4 remains closed a predetermined time after transistor T3 has been opened (i.e., rendered non-conducting). Hence, when capacitor C1 is charged with a random parasitic voltage at the opening of transistor T3, the output of amplifier A1 supplies a voltage equal to the sum of the feedback voltage Vfbk and of a variation proportional to the parasitic voltage on node 4. Since the capacitor C3 cannot charge any more through the transistor T3, the cell is after the opening of transistor T3, in a transitory state where the variation of the voltage of the output of amplifier A1 is transmitted through capacitor C3 to node 2, which causes the conductivity of transistor T1 to increase, thereby discharging capacitor C1 and bringing the voltage of node 4 back to Vrst which is then free of the unwanted noise voltage.

One skilled in the art will understand that the feedback block 8 may first over-discharge the capacitor C1, and that the feedback loop may bring the voltage of node 4 to Vrst after a few damped oscillations. The transistor T4 is opened after a predetermined time that is chosen so as to let the feedback loop substantially discharge the capacitor C1, and so as to be very short compared to the integration time. For example, the transistor T4 may be left closed for 5 µs after the opening of transistor T3, while a typical integration time is of about 10 ms. After the signal FDBK is inactivated, the capacitor C1 charges classically as a function of the sensing current. The reading of the output voltage after the integration time in the light sensing cell of FIG. 2 is as in a typical light sensing cell.

The transistor T4 being of the same type as the transistor T3, a random noise current flows through the transistor T4, and the capacitor C4 remains charged with a random parasitic voltage ΔV when the transistor T4 is opened. According to an aspect of the invention, the value of capacitor C4 is chosen bigger than capacitor C2, so as to minimize the noise voltage ΔV. In addition, the capacitor C3 is chosen smaller than the capacitor C1, so that a reduced noise voltage δV=ΔV.C3/C1 is transmitted to the node 4 when the transistor T4 is opened.

A sensing cell as illustrated in FIG. 2 therefore provides for a substantially reduced parasitic voltage on its output node 4 after it has been reset, thereby improving the performance of the cell in the dark. As an example, for capacitors C1 and C2 having respective values of 2 and 6 fF, capacitor C3 may have a value of 0.5 fF and capacitor C4 a value of 10 fF, to reduce the maximum kTC noise to 200 μV.

The operational amplifier A1, the transistor 14 and the capacitors C3, C4 are typical CMOS elements and a sensing cell as illustrated in FIG. 2 can be manufactured using a typical CMOS process.

Figure 3:
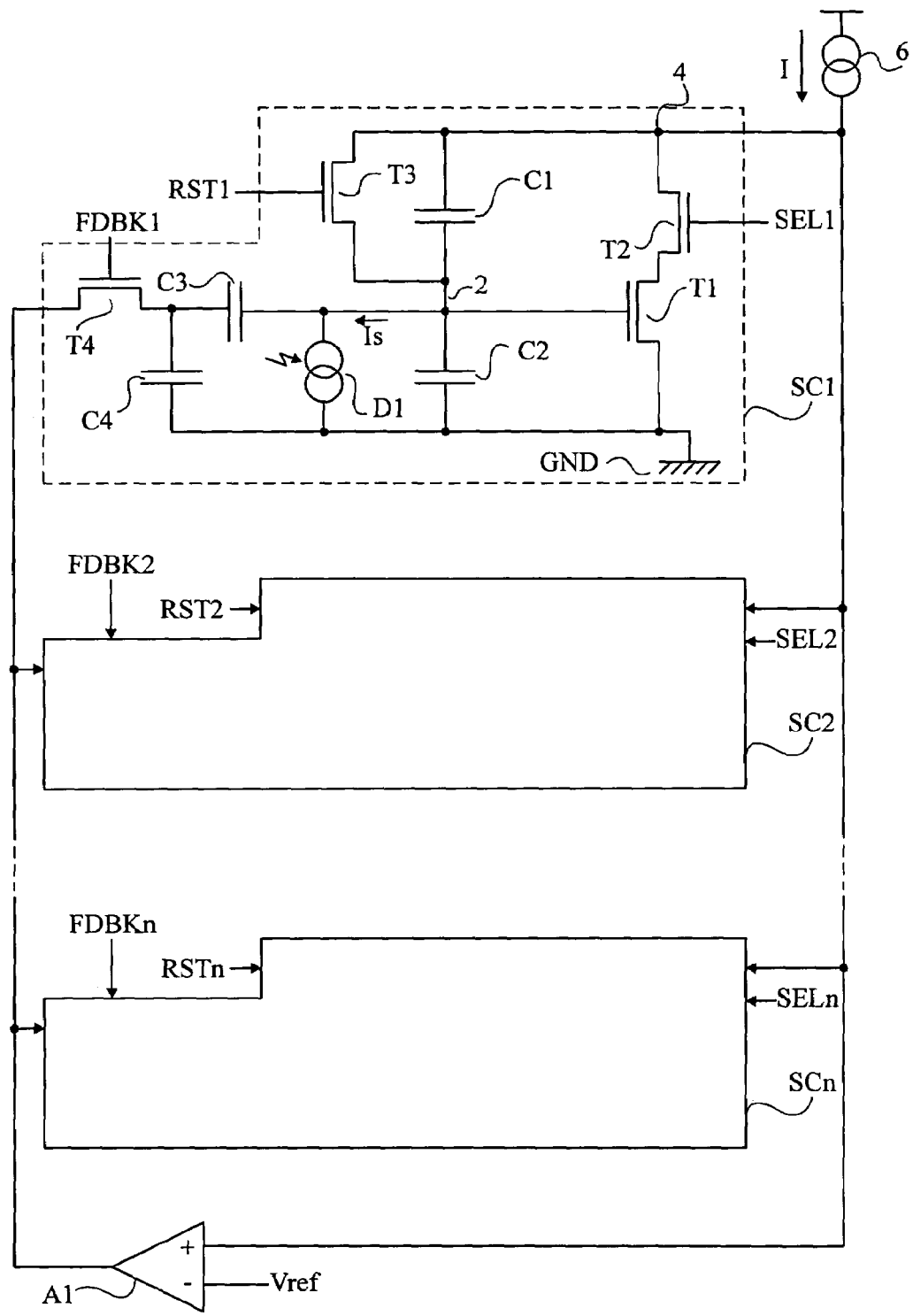
FIG. 3 schematically represents a portion of a light sensing array comprised of CMOS light sensing cells illustrating an aspect of the invention.

FIG. 3 schematically represents one of a plurality of columns of an integrated CMOS light sensing array illustrating an aspect of the invention. The column is comprised of a number n of light sensing cells SC1 to SCn. Each light sensing cell has substantially the same structure as the cell illustrated in FIG. 2, with the exception that the amplifier A1 is shared by the feedback block of each cell of the column. One single current source 6 is connected to the output node of all the cells of the column. Each cell SC1 to SCn of the column is provided with an individual selection signal SEL1 to SELn, an individual reset signal RST1 to RSTn, and an individual feedback control signal FDBK1 to FDBKn.

This allows for a reduction in the size of each cell, and therefore the size and cost of the light sensing array.

The operation of the light sensing cells is as for the light sensing cell illustrated in FIG. 2.

Figure 4:
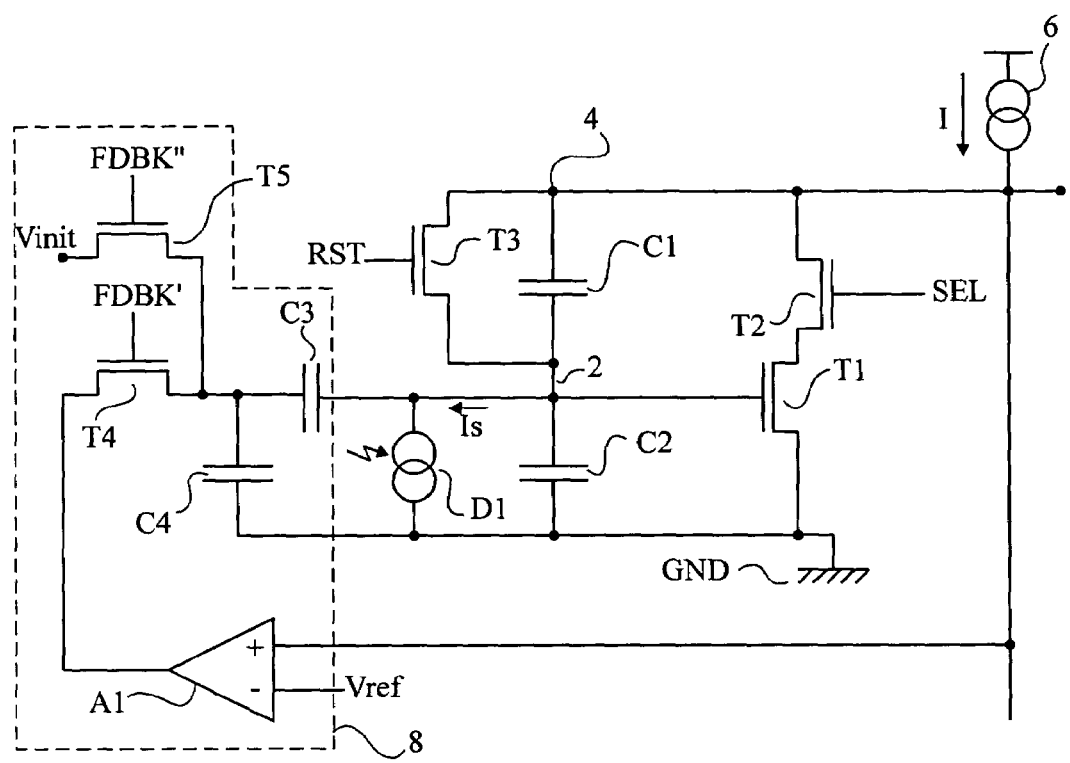
FIG. 4 schematically represents a CMOS light sensing cell according to the invention.

FIG. 4 schematically represents a CMOS light sensing cell according to the invention, comprising as the cell illustrated in FIG. 2 a sensor D1, capacitors C1 and C2, CMOS transistors T1, T2 and T3 and a feedback block 8. According to the invention, the feedback block 8 comprises an additional transistor T5. The amplifier A1, the capacitors C3, C4 and the transistor T4 are connected as in FIG. 2, although the transistor T4 does not receive the feedback control signal FDBK but a signal FDBK'. The transistor T5 is a MOS transistor of N-channel type that has a source connected to a fixed voltage Vinit and a drain connected to the drain of transistor T4. The gate of transistor T5 receives a feedback control signal FDBK".

The operation of a light sensing cell according to this embodiment is as follows. As in the light sensing cell of FIG. 2, the transistor T2 is first closed to select the cell, then the transistor T3 is closed for a given reset time to reset the cell. According to the invention, the signals FDBK' and FDBK" are initially inactivated so as to open transistors T4 and T5. The signal FDBK" is then activated to close transistor T5 while the transistor T3 is still closed and at least until the transistor T3 is opened. When the signal FDBK" is inactivated, the signal FDBK' is activated for a predetermined duration. The sum of the duration of the active states of the signals FDBK' and FDBK" is substantially equal to the duration of the signal FDBK previously described in relation with FIG. 2.

After a transitory state following the closing of T3 and T5, the cell stabilizes in a stable state where capacitor C1 is discharged, capacitor C2 is charged to Vrst, capacitor C4 is charged to Vinit and capacitor C3 is charged to Vrst−Vinit.

As previously described, amplifier A1 then supplies a given feedback voltage Vfbk that depends on Vrst−Vref and on the amplifying factor of A1. When the transistor T5 is opened and transistor T4 is closed, the feedback voltage Vfbk is supplied to the capacitor C3. Since the capacitor C3 is still charged to Vrst−Vinit, the voltage of node 2 is then equal to Vrst−Vinit+Vfbk. The cell then enters a transitory state during which the capacitor C1 charges (or discharges) to a fixed value for which the node 4 has a voltage such that the feedback loop brings the voltage of node 2 back to Vrst, at which time the cell is stabilized and the signal FDBK' can be inactivated. It can be shown that the final voltage of node 4 is set by Vinit, Vref and by the characteristics of the feedback loop, whatever the charge of capacitor C1 was at the opening of transistor T3 and whatever noise voltage was stored in capacitor C1. After the signal FDBK' is inactivated, the capacitor C1 charges classically as a function of the sensing current. The voltage of node 4 when the signal FDBK' is inactivated being a set voltage, non-illustrated offset means corrects the voltage measured at node 4 at the end of the integration time.

One skilled in the art will notice that the above embodiment of the invention is particularly useful for suppressing the components of the noise voltage that are slower than the feedback loop.

One skilled in the art will understand that there is advantageously no specific gain limitation for the amplifier A1, the only constraint being that the overall gain of the feedback loop is to be larger than one, a constraint that is easy to meet for different manufacturing batches despite process variations that may affect the values of the capacitors of the feedback loop.

One skilled in the art will notice that the light sensing cell illustrated in FIG. 4 may advantageously be connected to form an array, for example in the way illustrated in FIG. 3.

Of course, the present invention is capable of various alterations, modifications, and improvements which will readily occur to those skilled in the art. In particular, the operational amplifier of the feedback block may be formed in any known manner.

Also, it has been described above that the transistor T2 remains closed from the reset of the light sensing cell and during its integration time. However, the transistor T2 can be opened after the opening of the transistor T4, just to be closed only a short while at the end of the integration time, in order to allow for the reading of the output voltage of the sensing cell.

The transistor T2 can also be eliminated in light sensing cells that do not share a supply current source, such as the cells of a single row array for a scanner device. The invention has been described in relation with N-channel type MOS transistors, but one skilled in the art will, without difficulty, adapt the invention to P-channel MOS transistors, or to other transistors having a similar operation.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A light sensing cell comprising:
    output means for generating an output voltage depending on the voltage of a sensing node, the voltage of the sensing node varying as a function of a received light;
    a reset transistor operable to force the voltage of the sensing node to a reset voltage;
    a feedback loop comprising an operational amplifier operable to add, through a capacitive voltage divider, a correction voltage to the voltage of the sensing node, said correction voltage depending on the output voltage; and
    preset means for, during the operation of the reset transistor and until the amplifier is operated, setting an input of the capacitive voltage divider to a predetermined voltage.

2. A light sensing cell according to claim 1, comprising:
- a sensor for converting the received light into a sensing current, the sensing node receiving said sensing current;
- a first capacitor connected between the sensing node and an output node, said output node also receiving a supply current; and
- a second capacitor connecting the sensing node to ground;
- wherein the output means comprises an output transistor controlled by the voltage of the sensing node and coupled between the output node and the ground;
- wherein the operational amplifier has a first input receiving the voltage of the output node and a second input receiving a reference voltage, the output of the amplifier being connected to the input of the capacitive voltage divider through a first switch;
- and wherein the capacitive voltage divider comprises a third capacitor connected between the input of the capacitive voltage divider and the sensing node and a fourth capacitor connected between the input of the capacitive voltage divider and the ground.

3. A light sensing cell according to claim 2, wherein the output transistor is coupled to the output node through a cell selection switch controlled by a cell selection signal.

4. A light sensing array comprising a plurality of light sensing cells according to claim 3.

5. A light sensing array according to claim 4, wherein the light sensing cells form a plurality of groups, the feedback means of the light sensing cells of a same group sharing a same operational amplifier.

6. A light sensing array according to claim 5, wherein the output nodes of the light sensing cells of a same group are coupled to a same supply current source.

7. A light sensing array according to claim 5, wherein the light sensing cells are arranged in rows and columns, each column forming one of said groups.

8. A light sensing array according to claim 6, wherein the light sensing cells are arranged in rows and columns, each column forming one of said groups.

9. The light sensing array of claim 4, wherein the light sensing array is incorporated into an integrated circuit.

10. The light sensing cell according to claim 1, wherein the preset means for setting the input of the capacitive voltage divider to a predetermined voltage comprises a preset transistor having a source connected to a fixed voltage, a drain connected to the input of the capacitive voltage divider, and a gate.

11. The light sensing cell according to claim 10, wherein the drain of the preset transistor is connected to a drain of the first switch.

* * * * *